United States Patent
Chen et al.

(10) Patent No.: US 10,390,464 B1
(45) Date of Patent: Aug. 20, 2019

(54) SERVER HEAT DISSIPATION CHANNEL STRUCTURE

(71) Applicant: AIC INC., Taoyuan (TW)

(72) Inventors: Chin-Yen Chen, Taoyuan (TW); Hsih-Ting You, Taoyuan (TW); Yen-Chih Chen, Taoyuan (TW)

(73) Assignee: AIC INC., Taoyuan (TW)

( * ) Notice: Subject to any disclaimer, the term of this patent is extended or adjusted under 35 U.S.C. 154(b) by 0 days.

(21) Appl. No.: 16/207,602

(22) Filed: Dec. 3, 2018

(51) Int. Cl.
*H05K 7/20* (2006.01)

(52) U.S. Cl.
CPC ..... *H05K 7/20736* (2013.01); *H05K 7/20145* (2013.01); *H05K 7/20172* (2013.01)

(58) Field of Classification Search
CPC .............. H05K 7/20145; H05K 7/20172
See application file for complete search history.

(56) References Cited

U.S. PATENT DOCUMENTS

| | | | | |
|---|---|---|---|---|
| 2006/0056151 A1* | 3/2006 | Hara | ................. | H05K 7/20145 361/696 |
| 2009/0168346 A1* | 7/2009 | Miyoshi | ............. | H05K 7/20145 361/695 |
| 2012/0120595 A1* | 5/2012 | Sun | ........................... | G06F 1/20 361/679.47 |
| 2013/0070417 A1* | 3/2013 | Du | ............................ | G06F 1/20 361/695 |
| 2017/0131750 A1* | 5/2017 | Sato | ......................... | G06F 1/20 |
| 2017/0285698 A1* | 10/2017 | Kobayashi | ............ | G11B 33/14 |

* cited by examiner

*Primary Examiner* — Hung V Ngo
(74) *Attorney, Agent, or Firm* — Chun-Ming Shih; HDLS IPR Services

(57) ABSTRACT

A server heat dissipation channel structure, used in a server having a plurality of heat generating sources installed therein, includes an upper guiding shield, a lower guiding shield and a fan. The upper guiding shield includes an upper entrance section and a flow guiding channel extended therefrom. The lower guiding shield includes a lower entrance section and a first heat dissipation channel extended therefrom. The fan includes an air output plane facing toward the upper entrance section and the lower entrance section correspondingly at the same time. In addition, the upper guiding shield includes a downward slanted channel at a rear end of the flow guiding channel opposite from a rear end of the first heat dissipation channel and a second heat dissipation channel extended from the first heat dissipation channel. The first and second heat dissipating channels respectively pass through different heat generating sources installed inside the server.

10 Claims, 5 Drawing Sheets

SERVER HEAT DISSIPATION CHANNEL STRUCTURE

BACKGROUND OF THE INVENTION

Field of the Invention

The technical field relates to the cooling of a server, in particular, to a server heat dissipation channel structure.

Description of Related Art

With the popularity of network related industries, servers of industrial computers used in such industries tend to have cooling problems due to the increase of computing functions of servers. In a conventional server, it mainly utilizes a fan fluidly connected to the external in order to draw external air into the server such that multiple heat generating sources inside the server can be cooled.

Nevertheless, since different heat generating sources are installed inside the server, the cooling effect obtained from the fan is also different among such heat generating sources depending upon their relative distances away from the fan. For example, a heat generating source at a distance that is relatively adjacent to the fan is able to obtain a greater cooling effect since the air drawn in or blown by the fan passes such heat generating source first. On the other hand, for a heat generating source further away from the fan, since the air has already been heated as it carries away heat along the flow, the cooling effect for such heat generating source at a further distance is known to be relatively poorer. Consequently, the heat generating sources with poorer cooling effect may affect the normal operation of the server.

In view of above, the inventor seeks to overcome the aforementioned drawbacks associated with the currently existing technology after years of research and development along with the utilization of academic theories, which is also the objective of the development of the present invention.

SUMMARY OF THE INVENTION

A primary objective of the present invention is to provide a server heat dissipation channel structure, capable of providing a uniform cooling effect for a plurality of heat generating sources installed inside the server in a front-rear manner through uniform distribution of airflow. Consequently, it is able to prevent temperature difference among the plurality of heat generating sources inside one identical server caused by uneven cooling effect thereof that may affect the normal operation of the server.

To achieve the aforementioned objective, the present invention provides a server heat dissipation channel structure, used in a server having a plurality of heat generating sources installed therein, comprising an upper guiding shield, a lower guiding shield and a fan. The upper guiding shield includes an upper entrance section arranged at a position higher than the heat generating sources and a flow guiding channel extended from the upper entrance section. The lower guiding shield is positioned underneath the upper guide shield, and the lower guiding shield includes a lower entrance section and a first heat dissipation channel extended from the lower entrance section. The fan includes an air output plane facing toward the upper entrance section and the lower entrance section correspondingly at the same time. In addition, the upper guiding shield includes a downward slanted channel at a rear end of the flow guiding channel opposite from a rear end of the first heat dissipation channel. The downward slanted channel converges with the rear end of the first heat dissipation channel in order to form a second heat dissipation channel extended from the first heat dissipation channel, and the first and second heat dissipating channels respectively pass through different portions of the heat generating sources installed inside the server.

DETAILED DESCRIPTION OF THE INVENTION

The following provides a detailed technical content of the present invention along with the accompanied drawings. However, the accompanied drawings are provided for reference and illustrative purpose only such that they shall not be used to limit the scope of the present invention.

Figure 1:
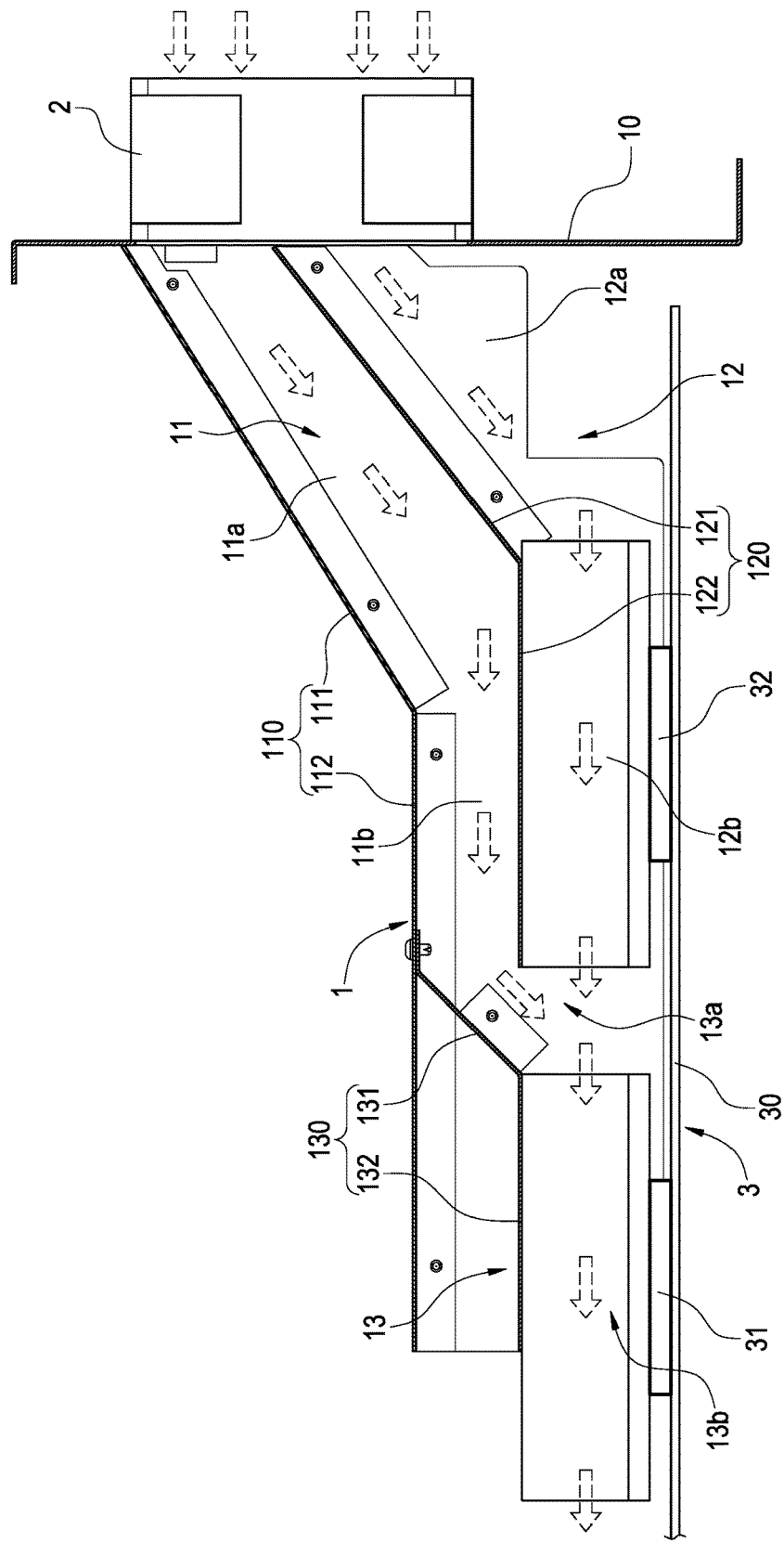
FIG. 1 is a schematic view of internal structure of the heat dissipation channels of the present invention.

Please refer to FIG. 1, showing a schematic view of internal structure of the heat dissipation channels of the present invention. The present invention provides a server heat dissipation channel structure 1, capable of being installed on any rack 10 inside a server 3, and can be installed in a server 3 having a plurality of heat generating sources 31, 32 therein. The server 3 at least includes a mainboard 30, and the mainboard 30 includes a first heat generating source 31 and a second heat generating source 32 arranged thereon respectively. In addition, in an exemplary embodiment of the present invention, a straight-line direction is used for providing the flow guidance and cooling needs of the second heat generating source 32 and the first heat generating source 31 respectively. In addition, it is able to allow the first heat generating source 31 at a relatively further end in the straight line to directly obtain an external air blown or drawn in at an ambient temperature (lower temperature), rather than receiving an air already being heated by other heat generating sources at a heat dissipation temperature (higher temperature). The server heat dissipation channel structure 1 comprises an upper guiding shield 11, a lower guiding shield 12 and a fan 2.

Figure 2:
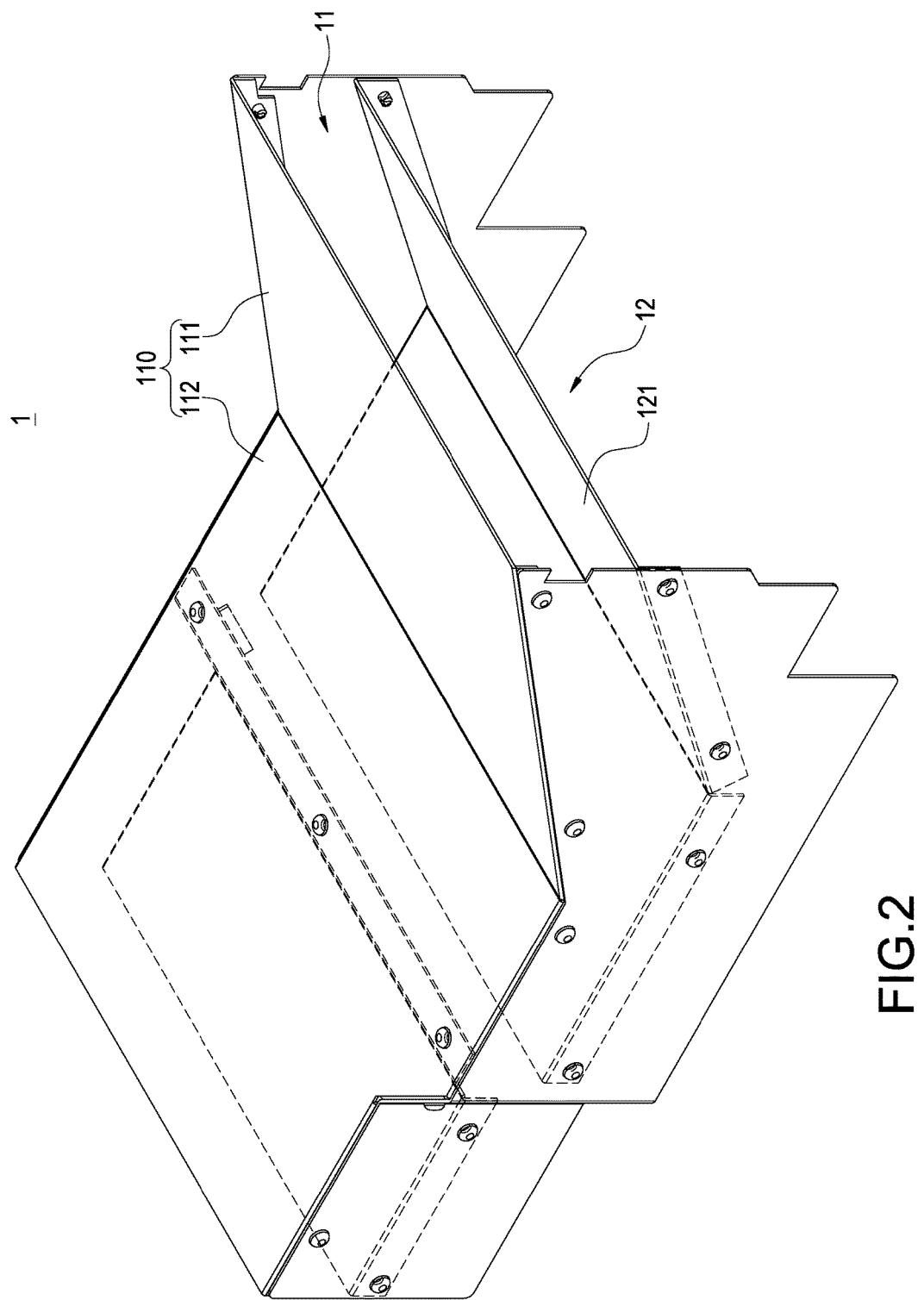
FIG. 2 is a perspective view of the upper and lower guiding shields of the present invention.
Figure 3:
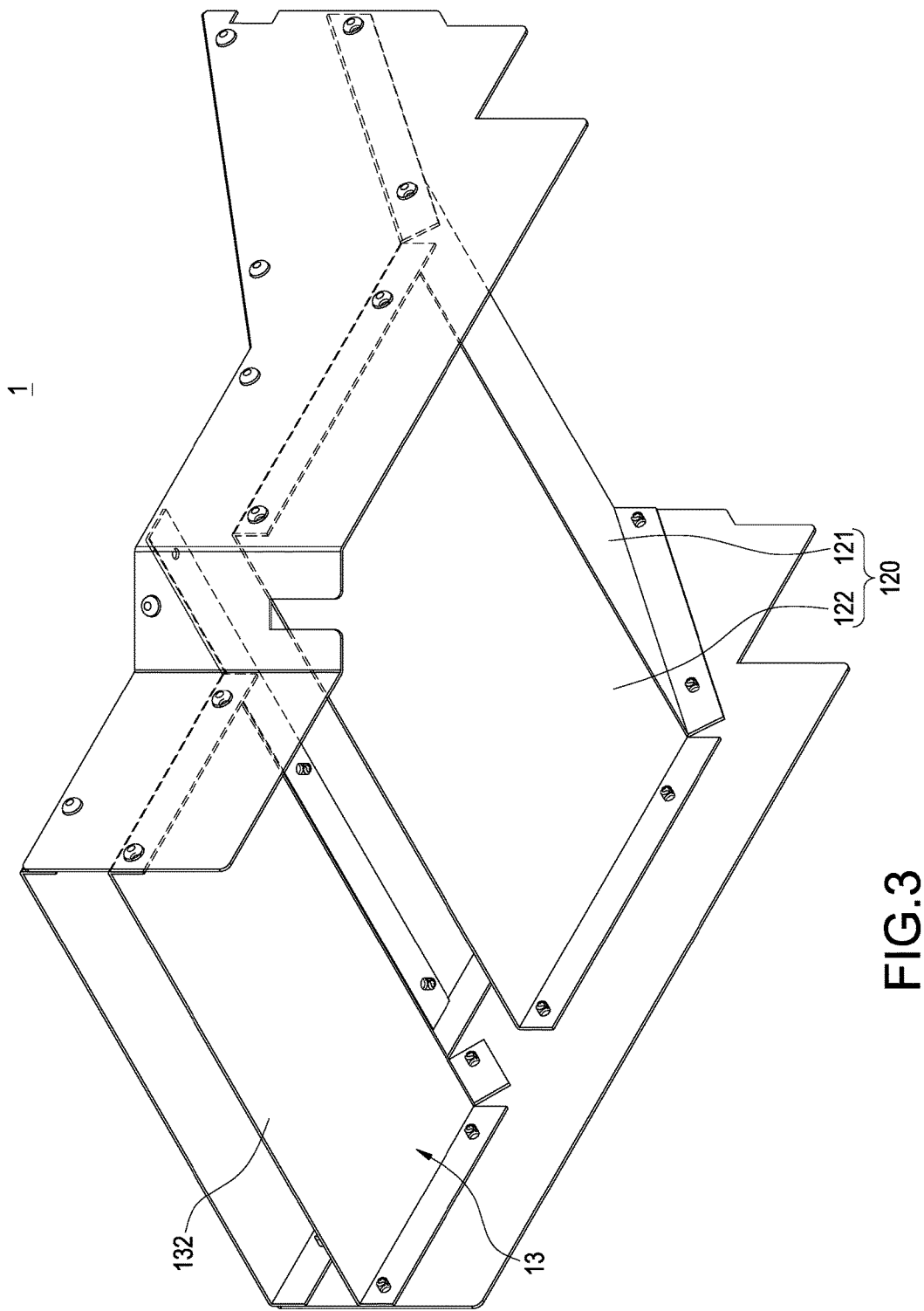
FIG. 3 is a perspective view of the upper and lower guiding shields of the present invention viewed from another angle.
Figure 4:
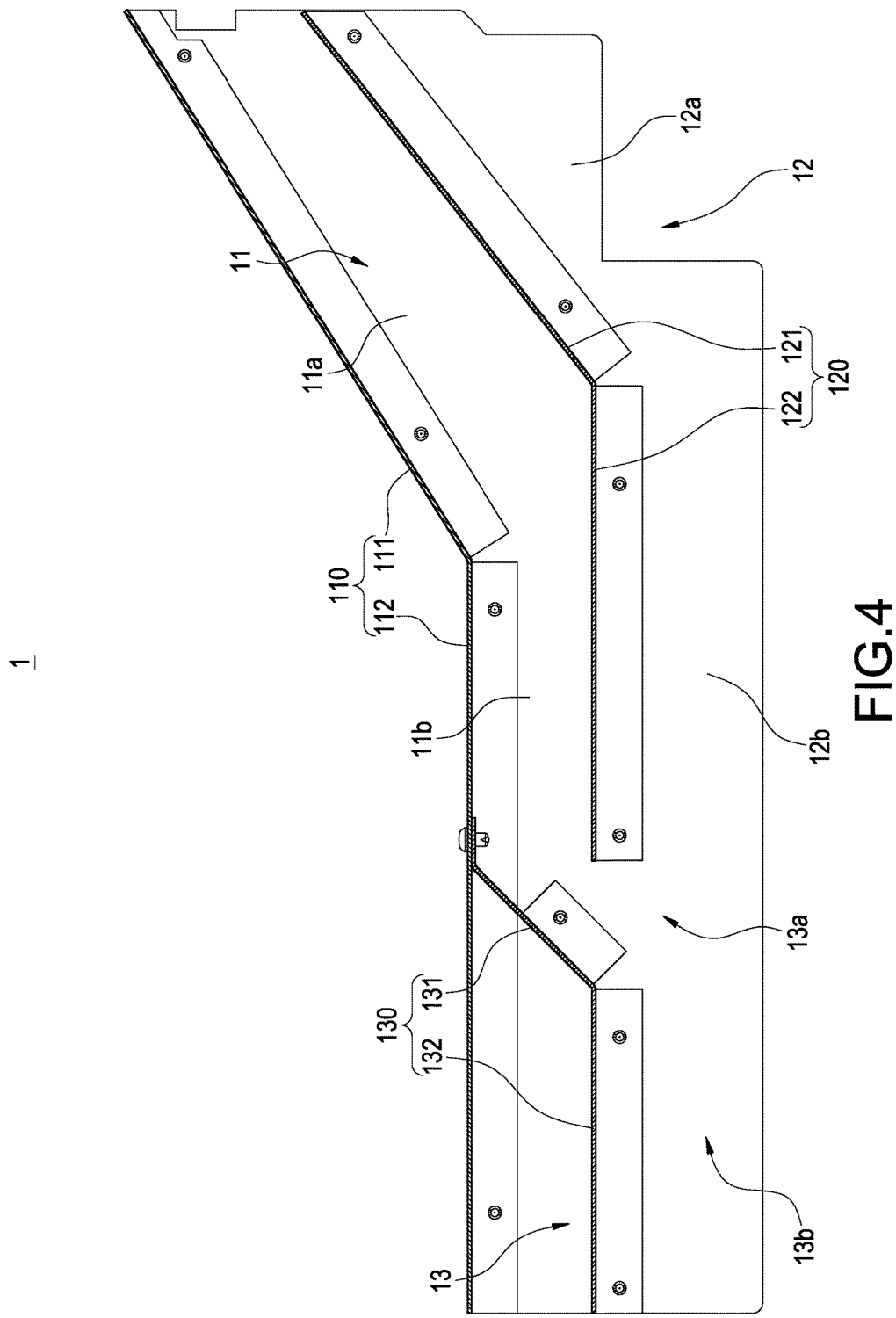
FIG. 4 is a cross sectional view of the upper and lower guiding shields of the present invention.

The upper guiding shield 11 includes an upper entrance section 11a arranged at a position higher than the heat generating sources 31 and 32 and a flow guiding channel 11b extended from the upper entrance section 11a. Please refer to FIG. 2 to FIG. 4. In an exemplary embodiment of the present invention, the upper guiding shield 11 is a frame member 110 having three sides connected to each other and formed by a metal sheet through a manufacturing process of bending and fastening, and it mainly includes an upper inclination portion 111 corresponding to the upper entrance section 11a and an upper extension portion 112 corresponding to the flow guiding channel 11b.

As shown in FIG. 1, the lower guiding shield 12 is positioned underneath the aforementioned upper guiding shield 11, and the lower guiding shield 12 includes a lower entrance section 12*a* and a first heat dissipation channel 12*b* extended from the lower entrance section 12*a*. The first heat dissipating channel 12*b* is relatively positioned at a lower portion of the flow guiding channel 11*b* of the upper guiding shield 11. In addition, please refer to FIG. 2 to FIG. 4. In an exemplary embodiment of the present invention, the lower guiding shield 12 can also be a frame member 120 fastened inside the upper guiding shield 11 and formed by a metal sheet through a manufacturing process of bending, and it mainly includes a lower inclination portion 121 corresponding to the lower entrance section 12*a* and a lower extension portion 122 corresponding to the first heat dissipating channel 12*b*.

Figure 5:
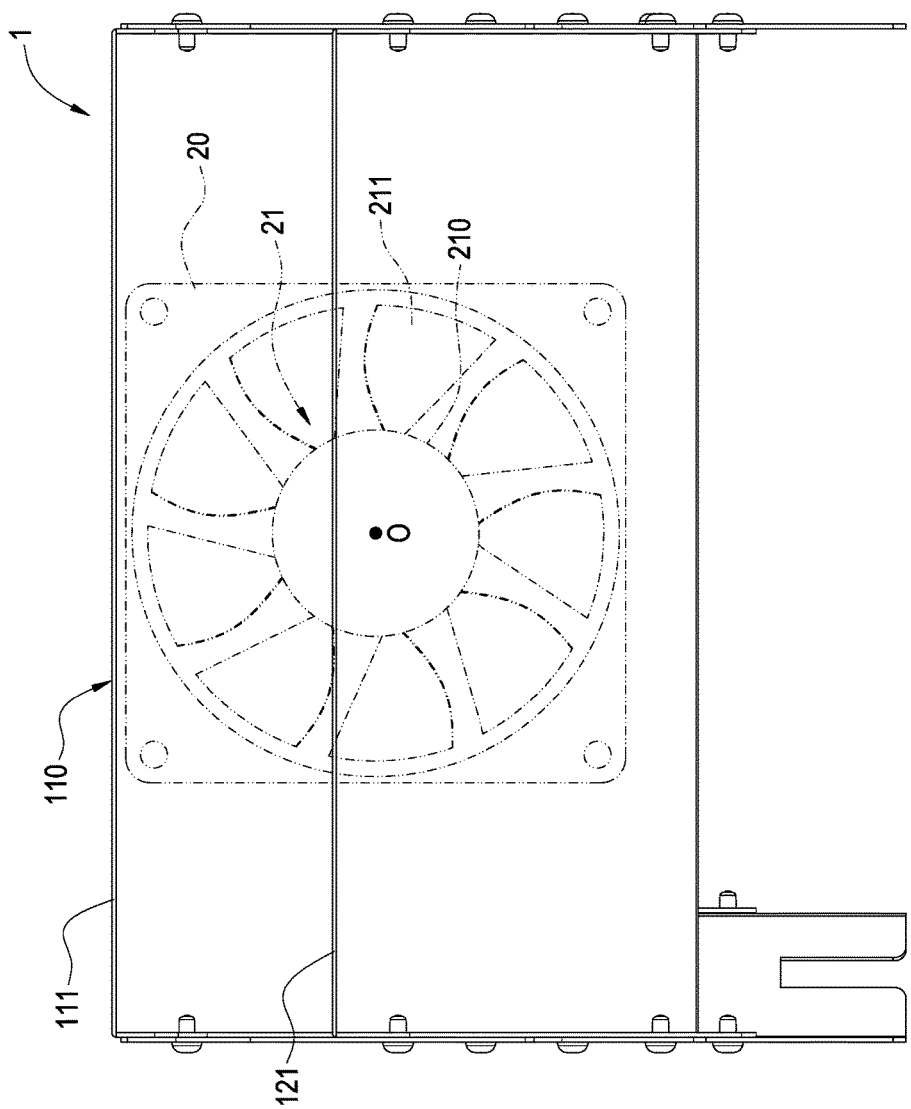
FIG. 5 is a schematic view showing the rear plane of the configuration of the upper and lower guiding shields as well as the installation position of the fan.

As shown in FIG. 1 and FIG. 5, the fan 2 has an air output plane, and the air output plane 20 can be configured according to an outer diameter of the fan blade wheel 21. In addition, the air output plane 20 is configured to face toward the upper entrance section 11*a* of the aforementioned upper guiding shield 11 and the lower entrance section 12*a* of the lower guiding shield 12 correspondingly at the same time. Consequently, the fan 2 is able to provide an external air drawn or blown into the upper entrance section 11*a* and the lower entrance section 12*a*.

As shown in FIG. 1, the present invention mainly includes the technical features of: The aforementioned upper guiding shield 11 includes a downward slanted channel 13*a* at a rear end of the flow guiding channel 11*b* opposite from a rear end of the first heat dissipation channel 12*b*; the downward slanted channel 13*a* converges with the rear end of the first heat dissipation channel 12*b* in order to form a second heat dissipation channel 13*b* extended from the first heat dissipation channel 12*b*; and the first and second heat dissipation channels 12*b*, 13*b* respectively pass through different heat generating sources 32, 31 installed inside the server 3. Please refer to FIG. 2 to FIG. 4 again. In an exemplary embodiment of the present invention, the downward slanted channel 13*a* and the second heat dissipation channel 13*b* are formed to pass through a downward slanted guiding shield 13 installed inside the upper guiding shield 11 and extended form the lower guiding shield 12. The downward slanted guiding shield 13 can also be a frame member 130 fastened inside the upper guiding shield 11 and formed by a metal sheet through a manufacturing process of bending, and it mainly includes a downward slanted portion 131 corresponding to the downward slanted channel 13*a* and a rear extension portion 132 corresponding to the second heat dissipation channel 13*b*.

Finally, as shown in FIG. 5, the aforementioned fan 2 is formed by a blade wheel 21 having a wheel hub 210 and a plurality of blades 211 arranged on the wheel hub 210. In addition, the wheel hub 210 uses a pivotal point O to perform rotation. In an exemplary embodiment of the present invention, the upper guiding shield 11 and the lower guiding shield 12 are arranged opposite from a projection of the air output plane 20 in such a way that the lower inclination portion 121 of the lower guiding shield 12 passes through the wheel hub 210 and is arranged higher than a top portion of the pivotal point O in order to allow the air drawn or blown in by the fan 2 to have most optimal configuration for the upper and lower guiding shields 11 and 12 respectively depending upon the needs.

Accordingly, with the aforementioned structural assembly, exemplary embodiments of the server heat dissipation channel structure of the present invention can be obtained.

In addition, for the server heat dissipation channel structure of the present invention, in an exemplary embodiment, it mainly uses a straight line to provide the cooling needs for the plurality of heat dissipation sources 31, 32 arranged in a straight line inside the server 3. In addition, for the heat generating source 31 at a distance relatively further away in the straight line direction, the configuration of the upper and lower guiding shields 11 and 12 of the present invention can still be used in conjunction with the lower downward slanted channel 13*a* to allow the airflow drawn or blown into the upper guiding shield 11 by the fan 2 to be directly guided to flow to the heat generating source 31 at a further distance. As a result, as long as a straight-line configuration is adopted, the heat generating source 31 at a further distance can still receive an external air at ambient temperature directly.

In view of the above, the present invention is able to achieve the objectives of the present invention and to overcome the drawbacks of known arts. The present invention is novel and of inventive step, which satisfies the patentability requirements.

The above describes the preferable and feasible exemplary embodiments of the present invention for illustrative purposes only, which shall not be treated as limitations of the scope of the present invention. Any equivalent changes and modifications made in accordance with the scope of the claims of the present invention shall be considered to be within the scope of the claim of the present invention.

What is claimed is:

1. A server heat dissipation channel structure, used in a server having a plurality of heat generating sources installed therein, comprising:
    an upper guiding shield having an upper entrance section arranged at a position higher than the heat generating sources and a flow guiding channel extended from the upper entrance section;
    a lower guiding shield positioned underneath the upper guide shield, and the lower guiding shield having a lower entrance section and a first heat dissipation channel extended from the lower entrance section; and
    a fan having an air output plane facing toward the upper entrance section and the lower entrance section correspondingly at the same time;
    wherein the upper guiding shield includes a downward slanted channel at a rear end of the flow guiding channel opposite from a rear end of the first heat dissipation channel; the downward slanted channel converges with the rear end of the first heat dissipation channel in order to form a second heat dissipation channel extended from the first heat dissipation channel; and the first and second heat dissipation channels respectively pass through different said heat generating sources installed inside the server.

2. The server heat dissipation channel structure according to claim 1, wherein the upper guiding shield is a frame member having three sides connected to each other and formed by a metal sheet through a manufacturing process of bending and fastening.

3. The server heat dissipation channel structure according to claim 1, wherein the upper guiding shield includes an upper inclination portion corresponding to the upper entrance section and an upper extension portion corresponding to the flow guiding channel.

4. The server heat dissipation channel structure according to claim 1, wherein the first heat dissipating channel of the lower guiding shield is relatively positioned at a lower portion of the flow guiding channel of the upper guiding shield.

5. The server heat dissipation channel structure according to claim 1, wherein the lower guiding shield is a frame member fastened inside the upper guiding shield and formed by a metal sheet through a manufacturing process of bending.

6. The server heat dissipation channel structure according to claim 1, wherein the lower guiding shield includes a lower inclination portion corresponding to the lower entrance section and a lower extension portion corresponding to the first heat dissipating channel.

7. The server heat dissipation channel structure according to claim 6, wherein the fan includes a blade wheel opposite from the air output plane; the blade wheel includes a wheel hub and a plurality of blades formed circumferentially on the blade wheel and configured to rotate with the wheel hub as a pivotal point; the upper guiding shield and the lower guiding shield are arranged opposite from a projection of the air output plane in such a way that the lower inclination portion passes through the wheel hub and is arranged higher than a top portion of the pivotal point.

8. The server heat dissipation channel structure according to claim 1, wherein the downward slanted channel and the second heat dissipation channel are formed to pass through a downward slanted guiding shield installed inside the upper guiding shield and extended from the lower guiding shield.

9. The server heat dissipation channel structure according to claim 8, wherein the downward slanted guiding shield is a frame member fastened inside the upper guiding shield and formed by a metal sheet through a manufacturing process of bending.

10. The server heat dissipation channel structure according to claim 8, wherein the downward slanted guiding shield includes a downward slanted portion corresponding to the downward slanted channel and a rear extension portion corresponding to the second heat dissipation channel.

* * * * *